(12) United States Patent
Werking (10) Patent No.: US 8,692,700 B2
(45) Date of Patent: Apr. 8, 2014

(54) SIGMA-DELTA DIGITAL-TO-ANALOG CONVERTER

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/462,345

(22) Filed: May 2, 2012

(65) Prior Publication Data

US 2013/0293401 A1    Nov. 7, 2013

(51) Int. Cl.
*H03M 3/00* (2006.01)

(52) U.S. Cl.
USPC .......................................... 341/143; 341/118

(58) Field of Classification Search
USPC .................................. 341/118, 143
See application file for complete search history.

(56) References Cited

U.S. PATENT DOCUMENTS

| | | | |
|---|---|---|---|
| 5,534,863 A | 7/1996 | Everitt et al. | |
| 5,635,936 A * | 6/1997 | Rybicki | 341/144 |
| 5,990,819 A | 11/1999 | Fujimori | |
| 6,177,897 B1 | 1/2001 | Williams, III | |
| 6,313,769 B1 * | 11/2001 | Mangahas et al. | 341/118 |
| 6,369,745 B1 | 4/2002 | Lee et al. | |
| 6,597,300 B2 * | 7/2003 | Mori | 341/144 |
| 6,693,574 B2 | 2/2004 | Yamamura | |
| 7,042,287 B2 * | 5/2006 | Robinson | 330/149 |
| 7,312,732 B2 | 12/2007 | Engl | |
| 7,567,193 B2 | 7/2009 | Ryu | |
| 7,576,671 B2 | 8/2009 | Petilli et al. | |
| 7,626,527 B1 | 12/2009 | Wang et al. | |
| 7,663,424 B2 | 2/2010 | Stulik | |
| 8,081,030 B2 | 12/2011 | Werking | |

OTHER PUBLICATIONS

Law, "Digital Calibration of Non-Ideal Pipelined Analog-to-Digital Converters", 2003, 132 pages.
Chen, "Analysis and Design of High-Speed A/D Converters in Sige Technology", 2007, 150 pages.
Rivera, "Design and Implementation of a Four Terminal Floating Amplifier and its Application in Analog Electronics," A thesis submitted in partial fulfillment of the requirements for the degree of Master of Science in Electrical Engineering, May 2005, 181 pages.
Mahan et al., "Gigaohm-Range Polycrystalline Silicon Resistors for Microelectronic Applications," IEEE Transactions on Electron Devices, vol. ED-30, No. 1, Jan. 1983, pp. 45-51.
Lane et al., "The Design of Thin-Film Polysilicon Resistors for Analog IC Applications," IEEE Transactions on Electron Devices, vol. 36, No. 4, Apr. 1989, pp. 738-744.
Ko et al., "A new polysilicon resistor model considering geometry dependent voltage characteristics for the deep submicron CMOS process," International Conference on Microelectronic Test Structures, IEEE, Mar. 2006, pp. 27-30.
Rivera, "Design and Implementation of a Four Terminal Floating Amplifier and Its Application in Analog Electronics," thesis in partial fulfillment of the requirements for the degree of Master of Science in Electrical Engineering, University of Puerto Rico, Mayagüez Campus, May 2005, 181 pp.

* cited by examiner

*Primary Examiner* — Khai M Nguyen
(74) *Attorney, Agent, or Firm* — Shumaker & Sieffert, P.A.

(57) ABSTRACT

A sigma-delta digital-to-analog converter (SD DAC) exhibits undesirable distortion when implemented in an integrated circuit due to the non-linearity of polysilicon resistors used in the filtering stages of the SD DAC. By using resistors other than polysilicon for the output resistor of an SD DAC, distortion can be reduced or eliminated. Additionally or alternatively, by generating an error correction signal, the distortion can be corrected.

19 Claims, 11 Drawing Sheets

SIGMA-DELTA DIGITAL-TO-ANALOG CONVERTER

TECHNICAL FIELD

This disclosure relates to digital-to-analog converters and, more specifically, to sigma-delta digital-to-analog converters.

BACKGROUND

A sigma-delta (SD) digital-to-analog converter (DAC) converts a digital signal to an analog signal. When implemented on an integrated circuit, the output signal of an SD DAC can have an undesirable distortion. While this distortion may be tolerable for many, or even most, applications, certain applications may require or benefit from an analog signal that has less distortion. As one example, an accelerometer for an inertial guidance system of an aircraft, spacecraft, smart bomb, satellite or other such air and space machinery may implement an SD DAC, and the distortion introduced by the SD DAC may in some instances lower the precision with which this machinery can be controlled or necessitate more frequent recalibration of flight paths. SD DACs can also be implemented in a wide array of other types of products. As another example, high end audio equipment may use SD DACs for converting digital audio information into an analog signal for processing by an amplifier and output by speakers, and in some instances, distortion introduced by the SD DAC may result in a degradation of sound quality.

SUMMARY

This disclosure generally describes techniques for improving the linearity of SD DACs by mitigating the effects of non-linear resistors, especially non-linear polysilicon resistors often used in SD DACs that are implemented in integrated circuits.

In one example, an SD DAC includes a translator stage comprising a sigma-delta modulator, wherein the translator stage is implemented on an integrated circuit; and, a filtering stage comprising an output resistor, wherein the output resistor is an approximately linear resistor, and wherein at least a portion of the filtering stage is implemented on the integrated circuit.

In another example, a circuit for performing sigma-delta digital-to-analog conversion includes a first path configured to perform sigma-delta digital-to-analog conversion on a digital input signal to generate an output signal; an error correction path configured to generate an error correction signal; an output resistor; and an adding stage configured to add the error correction signal to the output signal to produce a corrected output signal across the output resistor.

In another example, a method of performing sigma-delta digital-to-analog conversion includes performing sigma-delta digital-to-analog conversion on a digital input signal to generate an output signal; generating an error correction signal; and, adding the error correction signal to the output signal to produce a corrected output signal.

The details of one or more embodiments of the invention are set forth in the accompanying drawings and the description below. Other features, objects, and advantages of the invention will be apparent from the description and drawings, and from the claims.

DETAILED DESCRIPTION

A sigma-delta (SD) digital-to-analog converter (DAC) generally includes a translator stage, such as a voltage or current translator, followed by a filtering stage, such as a low pass filter (LPF). An SD DAC is typically configured to convert a digital pulse-density modulated (PDM) signal to a linear analog voltage or current signal, where both the digital and linear representations of the underlying signal are equivalent.

Figure 1:
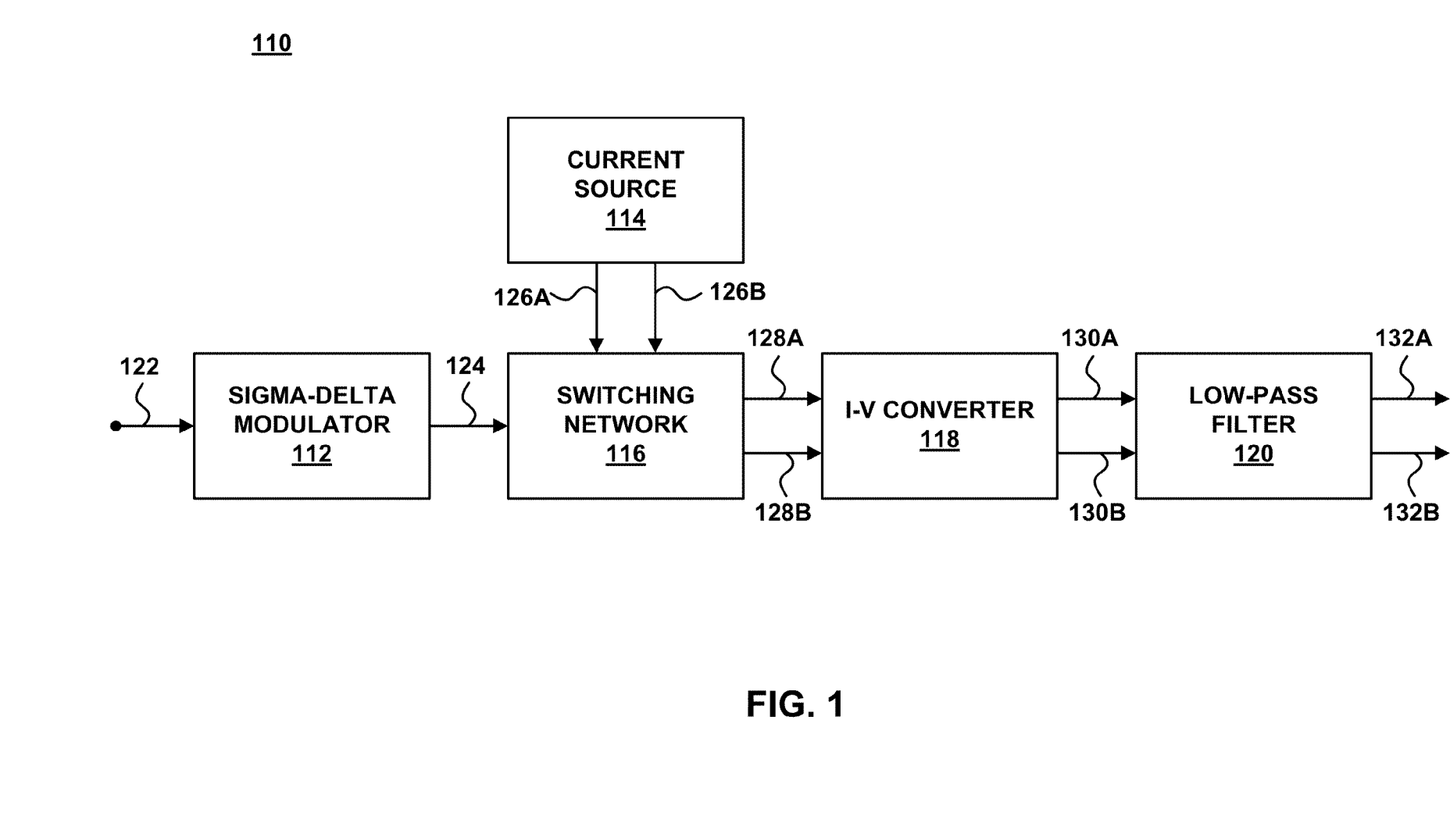
FIG. 1 shows a block diagram of an example current-mode SD DAC that may be used to implement various techniques of this disclosure.

FIG. 1 is a block diagram illustrating an example SD DAC system 110 according to this disclosure. SD DAC system 110 converts a digital input signal into an analog output signal representative of the digital input signal. SD DAC 110 includes a sigma-delta (SD) modulator 112, a differential current source 114, a switching network 116, a current-to-voltage converter 118, and a low-pass filter 120.

SD modulator 112 is configured to modulate or transform a digital input signal 122 into a digital bit-stream 124. Digital input signal 122 represents a stream of digital data values that will be converted to an analog output signal by SD DAC system 110. The digital values may be composed of any combination of bits that represent a digitized data value. For example, each group of N binary bits within digital input stream 122 may form a digital value. The N binary bits may represent data in various formats known in the art, such as, for example, an unsigned binary format or a two's complement format.

Digital bit-stream 124 may comprise a bit-stream representation of digital input signal 122 designed to control the switching operation of switching network 116. The format of digital bit-stream 124 allows switching network 116 to produce differential currents representative of the digital input signal 122.

SD modulator 112 uses sigma-delta techniques, which are known in the art, to transform digital value 122 into digital bit-stream 124. Thus, transformed digital bit-stream 124 represents the digital values of digital input signal 122 in a density-of-ones format. As used herein, a density-of-ones format refers to a data format where the average value of the bit-stream (i.e., duty cycle) is proportional to the data values represented by the bit-stream. Thus, the proportion or percentage of ones in bit-stream 124 represents a proportion or percentage of the full scale output voltage range of SD DAC system 110. The full scale output voltage range may refer to the range of voltages between a first analog output voltage representing the lowest possible digital value that can be produced by the SD DAC system 110 and a second analog output voltage representing the highest possible digital value that can be produced by SD DAC system 110.

Differential current source 114 is configured to generate a differential current for use by switching network 116. Differential current source 114 provides the differential current through current outputs 126A, 126B. As used herein, a differential current may refer to two different currents that are substantially equal in magnitude, but opposite in polarity. Differential current source 114 may generate the differential current based on a reference voltage supplied to differential current source 114. Differential current source 114 may include one or more source degeneration resistances to control the level of current matching between the current outputs 126A, 126B.

Differential current source 114 may comprise one or more current sources. In one example, differential current source 114 may contain a first current source that provides the first current output 126A and a second current source that provides the second current output 126B. Both the current sources may contain two source degeneration resistances. The level of matching between the first and second current outputs 126A, 126B may be predominately determined by the matching of the source degeneration resistances within each current source. In many circuit fabrication technologies, resistance matching is able to be controlled with a higher degree of precision than transistor device matching. Thus, the differential current source designed in accordance with this disclosure provides an improved level of current matching over prior techniques where transistor device matching dominated the level of current matching.

Switching network 116 can be configured to produce a differential current signal 128A, 128B based on digital bit-stream 124. In one example, switching network 116 may include a first switch that routes current from input 126A to either output 128A or output 128B based on the value of the current bit bit-stream 124. Similarly, switching network 116 may also include a second switch that routes current from input 126B to either output 128A or output 128B based on the value of the current bit in bit-stream 124. Thus, digital bit-stream 124 operates as a control signal that controls the switching of switching network 116. During a single switching cycle, the first and second switches are configured such that the current from output 126A and the current from output 126B are routed to different outputs. In this manner, the first and second switches operate together to selectively adjust the polarity of differential current 128A, 128B according to a bit within an input bit-stream to produce a differential current signal.

In one example, the switching network 116 includes a plurality of transistors. For instance, the switching network 116 may include four (4) transistors. The transistors may operate to direct the current to the resistors based on the value of DIN 124. Additionally or alternatively, the switching network 116 may include transmission gates. For example, the switching network 116 may be a double pole, double throw (DPDT) switch comprised of a plurality of transmission gates. The transmission gates may be Complementary Metal Oxide Semiconductor (CMOS) transmission gates. Other types of switching networks are possible as well.

Current-to-voltage converter 118 may be configured to convert a differential current signal 128A, 128B into a differential voltage signal 130A, 130B. In other words, current-to-voltage signal may transform a signal that is represented primarily by current variations into a signal that is represented primarily by voltage variations. Current-to-voltage converter 118 may regulate nodes 128A and 128B at a virtual ground voltage level. In this manner, current-to-voltage converter 118 allows the differential current source 114 and the switching network 16 to drive current into low-impedance nodes.

In one example, current-to-voltage converter 118 may include a fully-differential operational amplifier with substantially identical matched resistance feedback paths. In other words, a first feedback resistance may be coupled between an inverting output of the amplifier and a non-inverting input of the amplifier, and a second feedback resistance, which is matched to the first feedback resistance, may be coupled between a non-inverting output of the amplifier and an inverting input of the amplifier. Thus, the substantially identical or balanced feedback regulates nodes 128A and 128B at a virtual ground voltage level.

Low-pass filter 120 filters the differential voltage signal 130A, 130B to produce a filtered differential voltage signal 132A, 132B. The filtered differential voltage signal 132A, 132B provides an analog representation of digital input stream 122. Low-pass filter 120 may comprise any low-pass filter of any order having any number of poles designed according to known or future techniques. In one example, low-pass filter 120 may be a four-pole low-pass filter. Although low-pass filter 120 is described above as having differential outputs 132A, 132B, other example low-pass filters may be included within SD DAC system 110 that generate a single-ended output.

Figure 5:
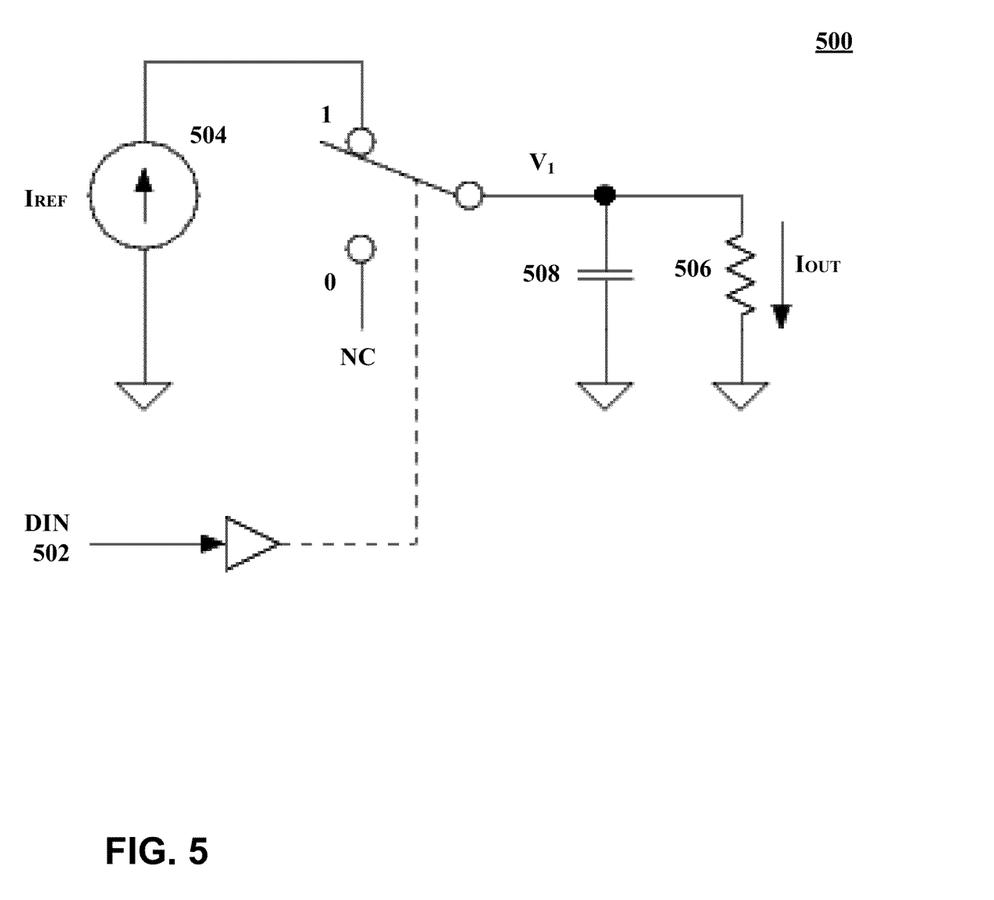
FIG. 5 shows a circuit diagram of an example current-mode SD DAC that may be used to implement various techniques of this disclosure.
Figure 6:
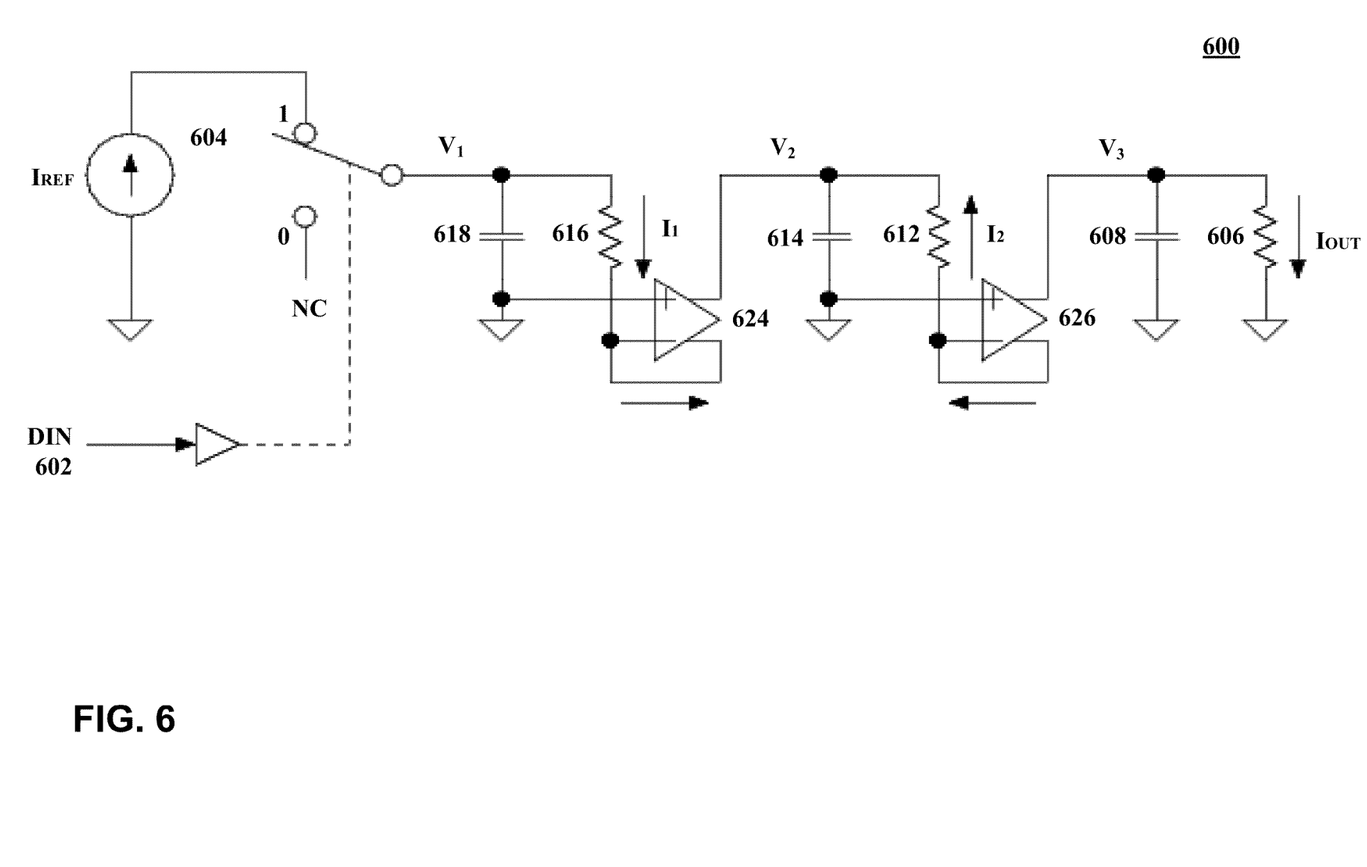
FIG. 6 shows a circuit diagram of an example current-mode SD DAC that may be used to implement various techniques of this disclosure.
Figure 9:
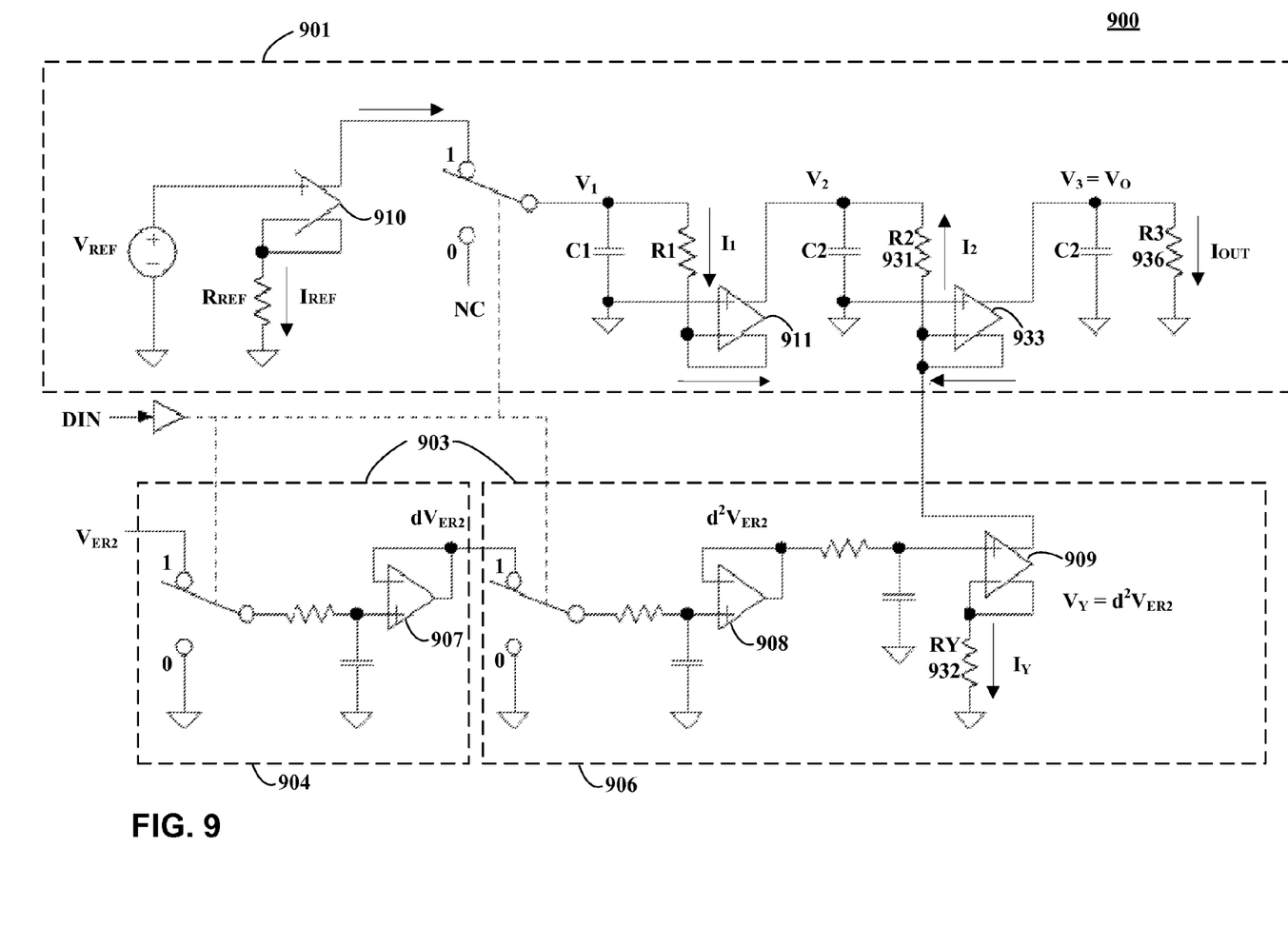
FIG. 9 shows a circuit diagram of an example implementation of the system shown in FIG. 8.

Although FIG. 1 shows current-to-voltage converter 118 as preceding low-pass filter 120 in the signal path, the ordering of these two components may be swapped such that low-pass filter 120 precedes current-to-voltage converter 118 in the signal path. Swapping the ordering of current-to-voltage converter 118 and low-pass filter 120 does not alter the functionality of SD DAC system 110. FIGS. 5, 6, and 9 for instance, which will be explained in more detail below, show a low-pass filtering stage that precedes a current-to-voltage conversion stage in a signal path. Additionally, in some instances where a current output is desired instead of a voltage output, current-to-voltage converter 118 may be omitted.

In general, the components of SD DAC system 110 work together to convert an input digital signal 122 into an analog output signal 132A, 132B. Differential current source 114, switching network 116, and current-to-voltage converter 118 may be grouped together to form a translator according to this disclosure. In some examples, the translator may be referred to as an SD DAC translator or as an SD DAC. FIG. 1 shows an example of a current-mode SD DAC. Additional example of SD DACs can be found in U.S. Pat. No. 7,956,782 issued 7 Jun. 2011 and U.S. Pat. No. 7,903,011 issued 8 Mar. 2011 both assigned to Honeywell International, Inc., the entire contents of which are hereby incorporated by reference in their entireties.

As will be explained in greater detail below, when implemented in chips, SD DACs such as SD DAC 110 may produce an output voltage with an undesirable distortion. This disclosure identifies one main cause of this undesirable distortion and describes techniques for reducing or eliminating this distortion, as well as techniques for correcting for this distortion. In particular, this disclosure analyzes distortion caused by non-linear components such as polysilicon resistors in low pass filter 120. Although FIG. 1 shows an example of a current-mode SD DAC, it is well known in the art that sigma-delta digital-to-analog conversion can also be implemented in voltage-mode SD DACs. Voltage-mode SD DACs, when implemented in silicon chips, typically exhibit the same distortion present in current-mode SD DACs, similarly due to non-linear components in the filtering stage of the DAC.

Figure 2:
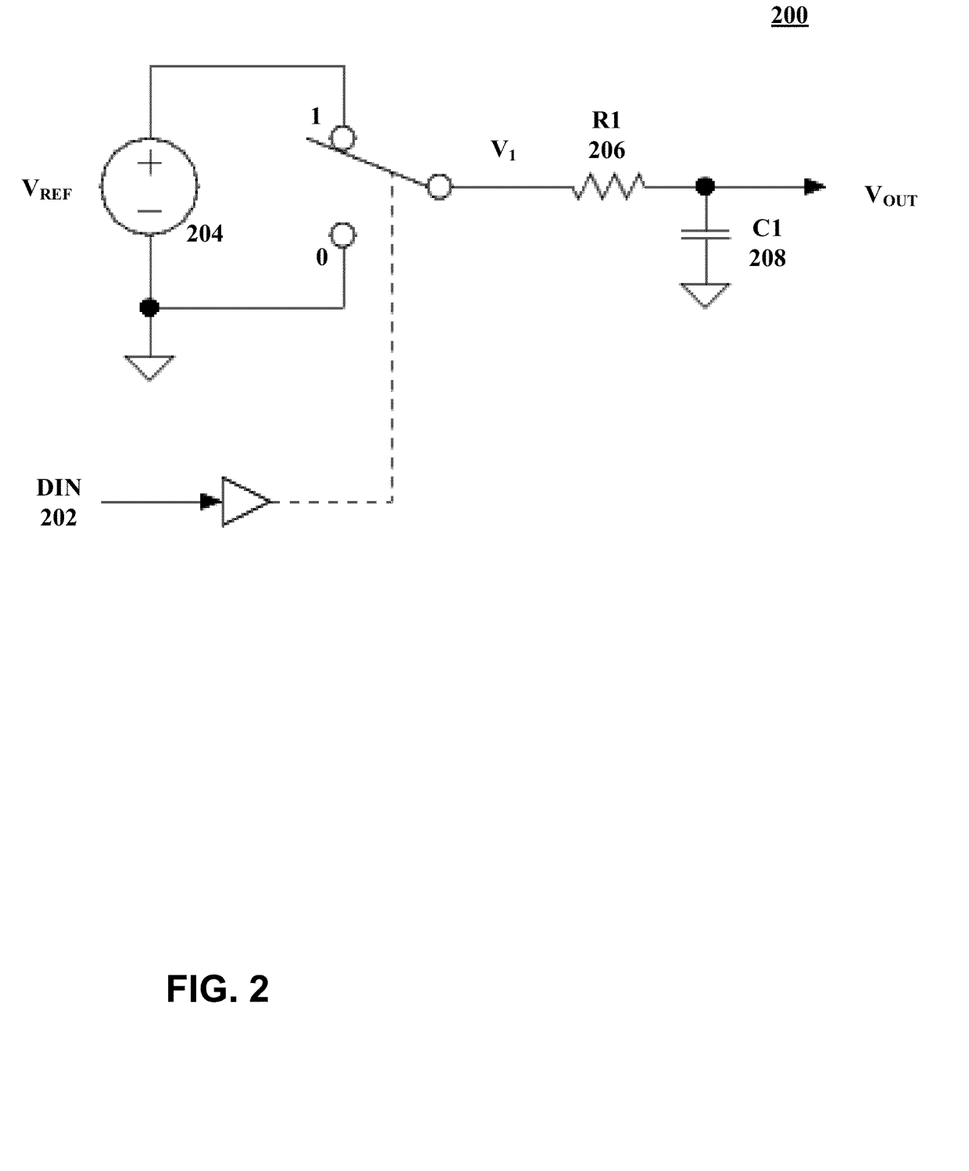
FIG. 2 shows a circuit diagram of an example voltage-mode SD DAC that may be used to implement various techniques of this disclosure.

FIG. 2 shows a circuit diagram of an example voltage-mode SD DAC 200. SD DAC 200 receives a digital input (DIN 202), which is a digital representation of an analog value. DIN 202 may, for example, be a series of 20-bit values, 16-bit values, or values of some other bit depth. Voltage translator 204 translates DIN 202 to one of two precise analog voltages (zero or $V_{REF}$) to produce a pulse-density encoded signal. The pulse-density encoded signal is low-pass filtered by a low-pass filter that includes a first resistor (R1 206) and a first capacitor (C1 208) to generate $V_{OUT}$, which approximates the duty cycle or density-of-ones (d) of the pulse-density modulated (PDM) digital input (DIN 202). R1 206 and C1 208 generally correspond to the filtering stage discussed above with reference to FIG. 1. For ideal components, $V_{OUT}$ may be approximated as follows for any fixed value of d where $0 \le d \le 1$.

$$V_{OUT} = dV_{REF} \tag{1}$$

The output voltage ($V_{OUT}$) includes two components—a constant (average) DC voltage and a smaller triangular waveform that is added to the DC voltage. This triangular waveform typically has a frequency close to the sample frequency ($f_S$) of the input data stream. In a typical SD DAC system, this sample frequency is much greater than the critical frequency ($f_0$) of the low pass filter. Consequently, the amplitude of this triangular waveform is much smaller than the DC (or average) portion of $V_{REF}$.

If a design such as that of FIG. 2 is implemented on an integrated circuit (IC) a distortion is added to $V_{out}$ due to R1 206 and C1 208 not being ideal components. In particular, MOS capacitors and poly-well capacitors typically have significant voltage coefficients due to their depletion regions, potentially making them undesirable for use in low distortion SD DAC designs. However, $SiO_2$ is a good dielectric so that poly-poly capacitors and metal-insulator-metal (MIM) capacitors made on silicon-based ICs have high linearity and thus are suitable for use in SD DAC designs such as SD DAC 200 without introducing significant distortion.

IC resistors based on wells and implants, however, tend to be non-linear due to their parasitic diodes. Oxide-isolated polysilicon resistors do not have significant depletion regions or junction barriers and are often used in DAC circuits. Polysilicon resistors can have voltage coefficients that vary significantly with process and layout parameters for an IC. The voltage coefficients may, for example, be on the order of 1000 ppm/V. In other words, the incremental resistance of a polysilicon resistor (r) can vary with the absolute value of the voltage (v) applied across its two terminals. In general, this can be expressed as follows.

$$r = r_0 + r_1|v| + r_2|v|^2 + r_3|v|^3 \tag{2}$$

Now, consider the effect of this non-linear resistance for R1 206 on SD DAC 200 of FIG. 2. As an example, assume the non-linear resistance of R1 206 is denoted as $R1(V_1 - V_{OUT})$, a function of the voltage across the two terminals of R1 206. Since $V_1$ can assume one of two values (zero or $V_{REF}$), R1 206 can likewise assume one of two values depending on the state of the input (i.e. DIN 202). These two values of resistance can be called R1H and R1L. For a given value of $V_{OUT}$, R1L and R1H can be defined as follows:

$$R1L = R1(-V_{OUT}) = R1(V_{OUT}) \tag{3a}$$

$$R1H = R1(V_{REF} - V_{OUT}) \tag{3b}$$

Note that $R1(-V_{OUT})$ is equivalent to $R1(V_{OUT})$ because, according to equation (2), the resistance of a polysilicon resistor is a function of the absolute value of the voltage across its two terminals. When d=½, the values of R1L and R1H are equal because:

$$V_{OUT} = \tfrac{1}{2}V_{REF}$$

In other words, $$R1L = R1(V_{OUT}) = R1(\tfrac{1}{2}V_{REF}) = R1(V_{REF} - \tfrac{1}{2}V_{REF}) = R1(V_{REF} - V_{OUT}) = R1H.$$

Otherwise, when d≠½, these two values of resistance (R1L and R1H) are not equal, which may cause an observable non-linearity or distortion. The amplitude of this distortion can be calculated as follows. When the circuit of FIG. 2 reaches an equilibrium (i.e., d is constant), the average current into C1 208 is zero. This implies that $I_H$, the average current through R1H from $V_1$ to $V_{OUT}$ when DIN=1, is the same as $I_L$, the average current through R1L from $V_{OUT}$ to ground when DIN=0, $$I_H = I_L \tag{4}$$

$$d(V_{REF} - V_{OUT})/R1H = (1-d)V_{OUT}/R1L \tag{5}$$

Solving for $V_{OUT}$ gives the following:

$$V_{OUT} = d\, V_{REF} \left\{ \frac{R1L}{(1-d)R1H + dR1L} \right\} \tag{6}$$

Note the similarity between equation (1) and equation (6). If an error factor (X) is defined such that:

$$X = R1L/[(1-d)R1H + dR1L] \tag{7}$$

then equation (6) equals equation (1) multiplied by this error factor.

$$V_{OUT} = dV_{REF}X \tag{8}$$

If R1 206 is linear, then R1H=R1L and X=1. Otherwise, if R1 206 is non-linear according to equation 2, then X will not be unity and the SD DAC will exhibit some form of non-linearity.

The techniques of this disclosure may, in some instances, make R1 206 more linear and thus may cause $V_{out}$ of SD DAC 200 to exhibit less distortion. The techniques of this disclosure include locating R1 206 off chip, while placing the other components of SD DAC 200 on chip. For example, C1 208 and voltage translator 204 can both be on an IC, while R1 206 may be connected to the IC by two or more input/output pads. In such an implementation, R1 206 may, for example, be a metal film resistor or a carbon film resistor.

Figure 3A:
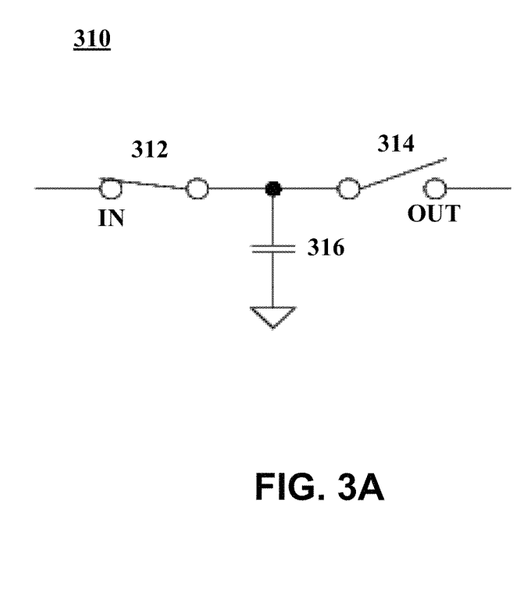
FIGS. 3A and 3B show circuit diagrams of example switched capacitor resistors that may be used in accordance with the techniques of this disclosure.
Figure 3B:
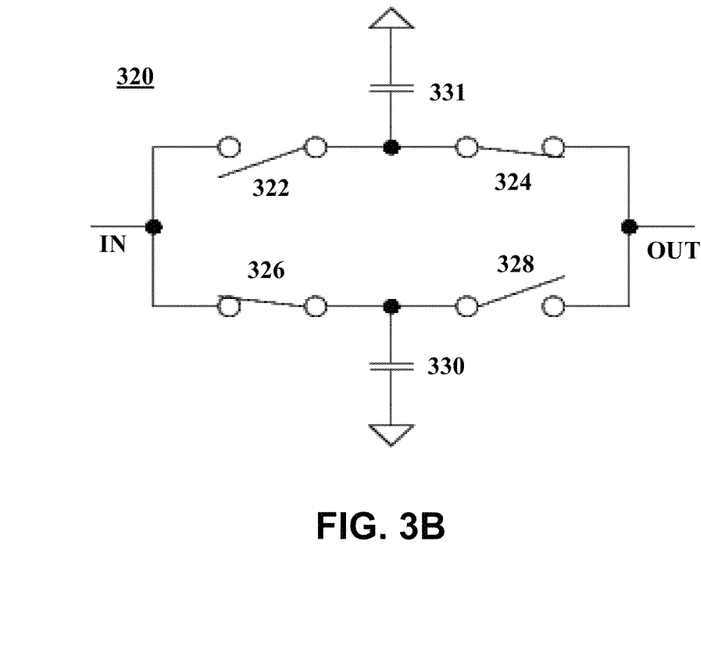

Additionally, the techniques of this disclosure can include the use of a switched capacitor resistor for R1 206. FIGS. 3A and 3B show examples of switched capacitor resistors. FIG. 3A shows an example of switched capacitor resistor 310, which includes a first switch 312, a second switch 314, and a capacitor 316. Switch 312 and switch 314 connect capacitor 316 to the input and output at a given frequency (i.e. the switching frequency f). Each switching cycle transfers charge from the input to the output.

FIG. 3B shows an example of switch capacitor resistor 320, which includes a first switch 322, a second switch 324, a third switch 326, a fourth switch 328, and capacitors 330 and 331. In the examples of FIGS. 3A and 3B, the equivalent resistors can essentially be as linear as the capacitors used as long as the switch resistance is sufficiently low and clock used to drive the switches is at a sufficiently high frequency.

Figure 4:
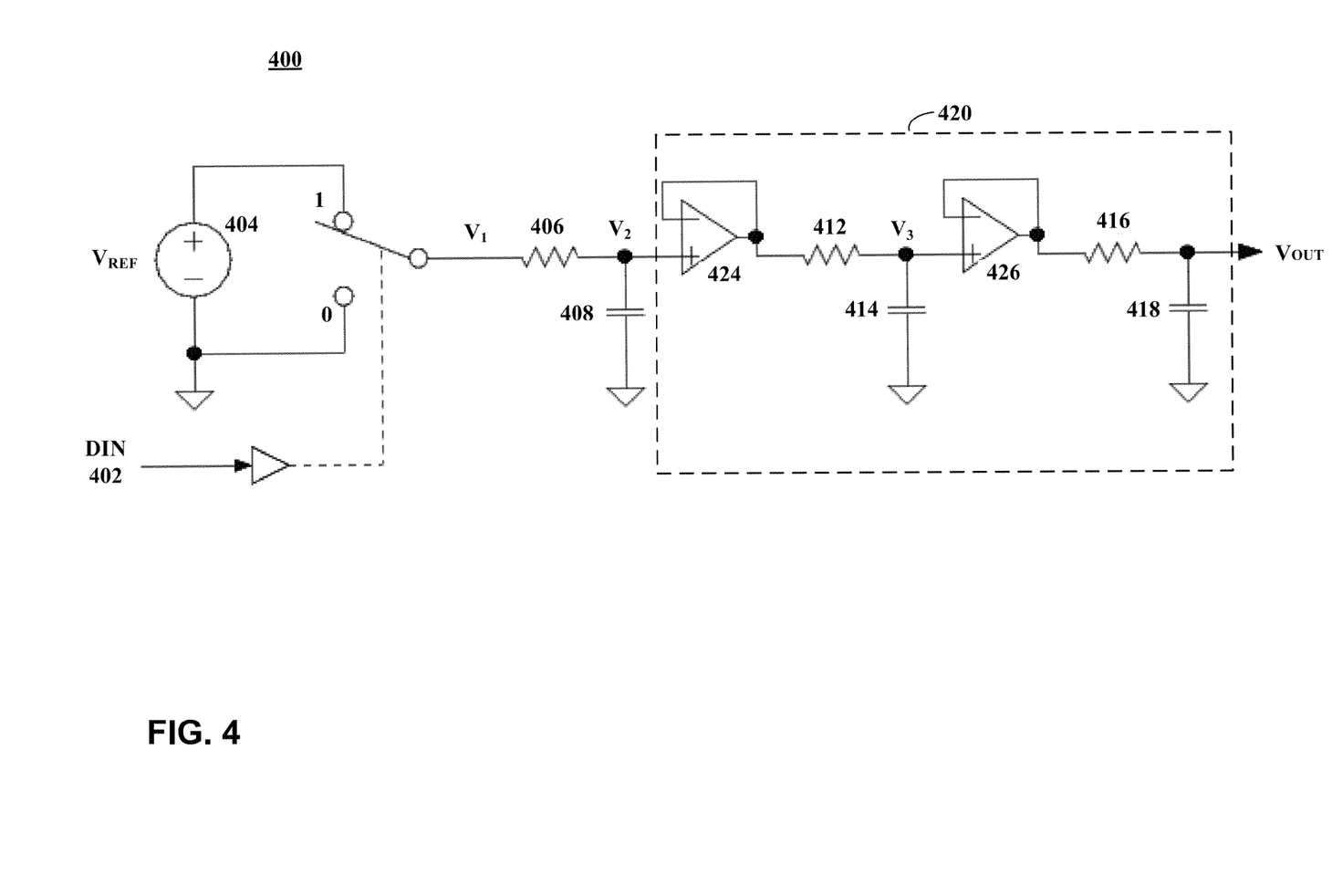
FIG. 4 shows a circuit diagram of an example voltage-mode SD DAC that may be used to implement various techniques of this disclosure.

SD DAC 200 of FIG. 2 is a simple circuit with a first order LPF used to illustrate some of the techniques of this disclosure. It should be appreciated, however, that the techniques described in relation to FIG. 2 can be applied to a wide range of possible SD DAC designs. As one of a myriad of possible designs, FIG. 4 shows an example of a voltage-mode SD DAC 400 with a third order LPF. Similar to SD DAC 200 of FIG. 2, SD DAC 400 receives a digital input (DIN 402). Voltage translator 404 translates DIN 402 to one of two precise analog voltages (zero or $V_{REF}$) to produce a time encoded signal. The time encoded signal is then low-pass filtered by a first resistor 406 and a first capacitor 408 to generate V2. V2 is then filtered by two additional stages of low pass filtering. The two additional stages of filtering (shown in box 420) include a second resistor 412, a second capacitor 414, a third resistor 416, and a third capacitor 418, a first operational amplifier 424, and a second operational amplifier 426.

In a circuit, such as SD DAC 400 of FIG. 4, the distortion introduced by the first resistor (i.e. resistor 406 in FIG. 4) can dominate over the distortion contributions from the other resistors (i.e. resistors 412 and 416) because the amplitude of the triangle wave at the output of this first stage is much lower than the amplitude of the square wave at the input of resistor 406. However, the second resistor 412 contributes more distortion than the third resistor 416. To limit the magnitude of this secondary effect on distortion to less than one-tenth of the primary effect described by equation (6), the frequency of the triangle wave can be more than 10 $f_0$ and the sample frequency can be $f_S > 50 f_0$.

Those skilled in the art of filter design will appreciate that the first and third order filter shown in FIGS. 2 and 4 are only two of many possible designs that could implement the techniques of this disclosure. In general, as long as there is little or no DC current flow through all resistors except the first resistor (i.e. resistor 406 in FIG. 4), then equation (6) holds as a useful approximation for all of these designs when $f_S > 50 f_0$. Furthermore, it can apply to any $n^{th}$ order filter where n is any positive integer greater than zero.

Accordingly, using the techniques of this disclosure, resistor 406 of FIG. 4 can be implemented as an off chip resistor, while some or all of the remaining components shown in FIG. 4 can be implemented on chip. If resistor 406 is implemented off chip, it may, for example, be implemented as a metal film resistor, a carbon film resistor, or any other type of linear resistor. Additionally, resistor 406 of FIG. 4 may be implemented as a switched capacitor resistor, such as the switched capacitor resistors shown in FIGS. 3A and 3B. Resistors 412 and 416 can be implemented as switched capacitor resistors such as those shown in FIGS. 3A and 3B, but may also be implemented as polysilicon or some other type of resistor.

FIG. 5 shows an example of a current-mode SD DAC 500. SD DAC 500 receives a digital input (DIN 502), which may be a digital representation of an analog value. DIN 502 may, for example, be a series of 20-bit values, 16-bit values, or values of some other bit depth. Current translator 504 translates DIN 502 (d) to one of two precise analog currents (no current or $I_{REF}$) to produce a time encoded signal. This time encoded signal is low-pass filtered by a low pas filter comprising capacitor C1 508 and resistor R1 506 to form an average output current $I_{OUT}$ which is a function of the duty cycle or density-of-ones (d) of the pulse-density modulated (PDM) digital input. For ideal components, $I_{OUT}$ may be approximated as follows for any fixed value of d where $0 \leq d \leq 1$.

$$I_{OUT} = d I_{REF} \quad (9)$$

As was the case with the voltage-mode SD DAC 200 of FIG. 2, the output current of SD DAC 500 can consist of two components: a constant DC current and a much smaller triangular waveform that is added to the constant DC current. As before, this triangular waveform can have a frequency that is close to $f_S$ and can generally be neglected for $f_S \gg f_0$.

If this design is implemented in an integrated circuit, it is reasonable to assume that C1 508 is highly linear. As before, however, the resistance of a polysilicon resistor can vary with the absolute value of the voltage ($V_1$) applied across its two terminals per equation 2 above. Thus, the current output of SD DAC 500 may have little or no distortion due to resistor voltage coefficients. However, if the output current from SD DAC 500 is converted to a voltage output across resistor 506, then distortion can be introduced into the voltage output due to the voltage coefficient of resistor 506. To reduce this distortion, it can be desirable for the resistor used to perform this conversion to be a linear resistor.

In the example, of FIG. 5, resistor 506 is the resistor used for converting the output current into an output voltage. Accordingly, using the techniques of this disclosure, resistor 506 of FIG. 5 can be implemented as an off chip resistor, while some or all of the remaining components shown in FIG. 5 can be implemented on chip. If resistor 506 is implemented off chip, it may, for example, be implemented as a metal film resistor or a carbon film resistor. Additionally, resistor 506 of FIG. 5 may be implemented as a switched capacitor resistor, such as the switched capacitor resistors shown in FIGS. 3A and 3B.

FIG. 6 shows an example of an SD DAC 600 with a current-mode third-order filter. Similar to SD DAC 500 of FIG. 5, SD DAC 600 receives a digital input (DIN 602). Current translator 604 translates DIN 602 to one of two precise analog currents (no current or $I_{REF}$). The time encoded signal is then low-pass filtered by a third-order low pass filter that includes a first resistor 616, a first capacitor 618, a second resistor 612, a second capacitor 614, a third resistor 606, a third capacitor 608, a first current conveyor amplifier 624, and a second current conveyor amplifier 626. Each current conveyor is drawn as a dual output transconductance amplifier (DOTA) for clarity, examples of which are shown in U.S. Pat. No. 8,081,030 issued 20 Dec. 2011, the contents of which are hereby incorporated by reference in their entirety.

If converting the output current ($I_{OUT}$) from SD DAC 600 to a voltage, then it can be desirable for the resistor (i.e. resistor 606) used to perform this conversion to be linear or approximately linear. In this manner, the output conversion issues of SD DAC 600 are the same as the output conversion issues discussed above for SD DAC 500, and can be the same for other SD DACs regardless of the order of filter used. Accordingly, using the techniques of this disclosure, the resistor used to perform the current to voltage conversion can be implemented as an off chip resistor or as a switched capacitor resistor.

In SD DAC 600, for example, resistor 606 of FIG. 6 can be implemented as an off chip resistor, while some or all of the remaining components of SD DAC 600 can be implemented on chip. If resistor 606 is implemented off chip, it may, for example, be implemented as a metal film resistor or a carbon film resistor. For example, resistor 606 can be implemented as an off chip resistor, while capacitor 608, resistor 612, capacitor 614, resistor 616, and capacitor 618 are implemented as on chip components.

Additionally, resistor 606 of FIG. 6 can be implemented as a switched capacitor resistor, such as the switched capacitor resistors shown in FIGS. 3A and 3B. Resistors 612 and 616 can be implemented as switched capacitor resistors such as those shown in FIGS. 3A and 3B, but may also be implemented as polysilicon or some other type of resistor.

The techniques discussed in this disclosure thus far have generally addressed reducing distortion that is present in the voltages of an output resistor in SD DACs. As will be discussed, this disclosure also describes techniques for correcting the distortion that is present at the voltage of an output resistor. For current-mode SD DAC circuits, such as those shown in FIGS. 4 and 5, this disclosure describes techniques that can correct for the distortion that is present at the voltage across the output resistor. Before discussing techniques for correcting the distortion, however, techniques for calculating the distortion will first be discussed.

In general, the filter structure of FIG. 6 may be extended to n-stages to make an $n^{th}$-order filter. Those skilled in the art will recognize that the filter structure shown in FIG. 6 is only one example of many possible ways to design a current-mode filter. A filter structure similar to that shown in FIG. 6 but with a polysilicon output resistor used for resistor 606 does generally not produce a distorted output current. Other filter structures also tend to share the property that the output current is not distorted due to the non-linearity of the resistors used, even when polysilicon resistors are used as output resistors. The $f_0$ of the filter can be affected by the resistor voltage coefficients and this may even modulate the higher frequency, out-of-band, signals near $f_S$ creating higher frequency harmonics. However, the average output current is generally not affected and follows equation (9) above.

When converting the output current from this form of an SD DAC to a voltage, however, a non-linear resistor, such as a polysilicon resistor, can cause a significant and undesirable distortion, as explained above. Referring back to FIG. 6, for example, a current-mode SD DAC where resistor 606 is a polysilicon resistor has an undesirable distortion due to the voltage coefficient of resistor 606.

This output conversion problem is typically the same regardless of the order of the filter. Consider the circuit of FIG. 5, discussed above. Assume resistor 506 is a polysilicon resistor and let R1Y represent the resistance of resistor 506 (represented as R1 in the equations below) as a function of the voltage across it ($V_1$) so that:

$$R1Y = R1(V_1) \quad (10)$$

The output voltage across resistor 406 conforms to the following equation.

$$V_{OUT} = I_{OUT} R1Y = dI_{REF} R1Y \quad (11)$$

If R1Y has only two terms, $r_0$ and $r_1$, then this may be approximated as $$V_{OUT} = V_0[1 + (r_1/r_0)V_0], \text{ where } V_0 = dI_{REF} r_0 \quad (12)$$

This may also be expressed as the following.

$$V_{OUT} = V_0 + (r_1/r_0)V_0^2, \text{ where } V_0 = dI_{REF} r_0 \quad (13)$$

Figure 7A:
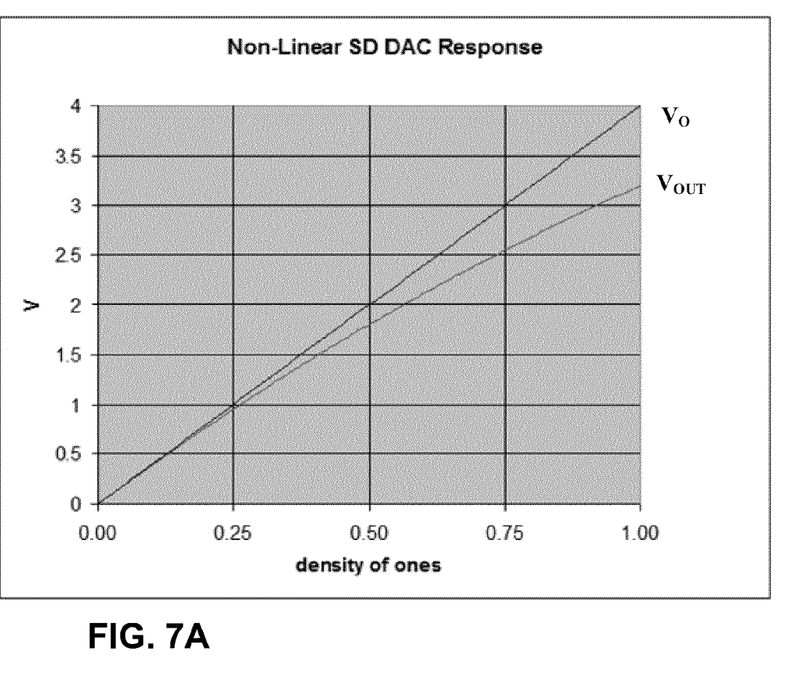
FIGS. 7A and 7B show plots illustrating the non-linearity exhibited by prior art SD DACs.
Figure 7B:
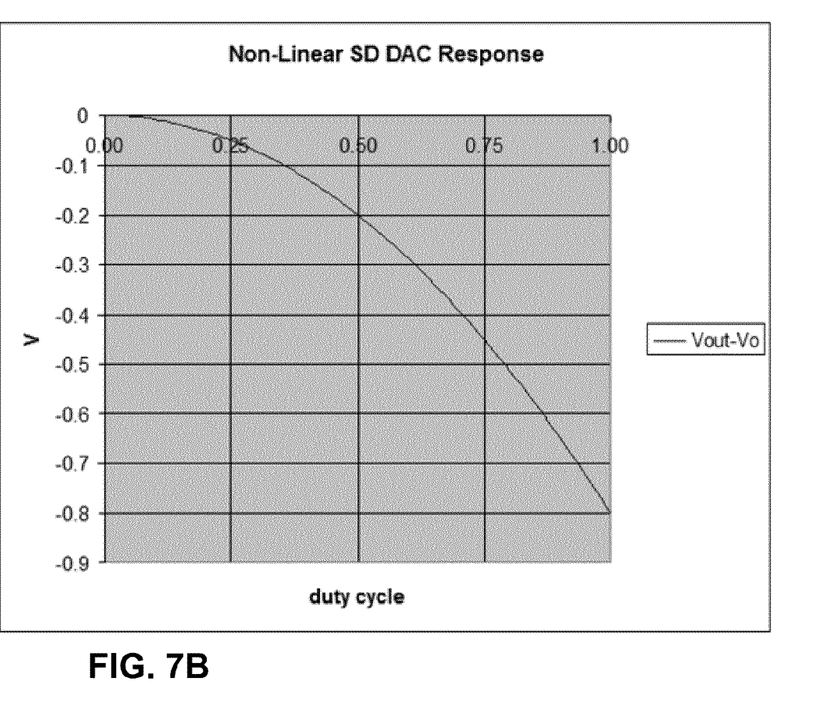

$V_{OUT}$ and $V_O$ are plotted in FIG. 7A for the case where $I_{REF} r_0 = 4V$ and $r_1 = -r_0/20$. This −5%/V voltage coefficient for R1 may be unusually high, but for purposes of explanation, it makes the difference between $V_O$ and $V_{OUT}$ more visible. This square law distortion is more obvious in the plot shown in FIG. 7B which shows $V_{OUT} - V_O$. Note that there is no distortion at d=0 and maximum distortion at d=1 where the error voltage is −800 mV or −20%. When R1 has a voltage coefficient of −1000 ppm/V, the shape of the plotted error voltage is the same but the magnitude of the peak error is −16 mV or −4000 ppm.

Equation 13 can be rewritten as follows if the full scale output voltage, $V_{FS}$, is defined to be $V_{FS} = I_{REF} r_0$.

$$V_{OUT} = dV_{FS} + (r_1/r_0)d^2 V_{FS}^2 \quad (14)$$

By defining a second order error voltage, $V_{ER2} = (r_1/r_0) V_{FS}^2$, this equation becomes the following. (Note that the second order error voltage is a function of the first order resistor voltage coefficient.)

$$V_{OUT} = dV_{FS} + d^2 V_{ER2} \quad (15)$$

This second order error voltage represents the difference between what the DAC output is, $V_{OUT}(d=1)$, and what the DAC output should be, $V_0(d=1)$, at full scale. In other words, at d=1, equation (15) reduces to equation (16).

$$V_{OUT} = V_{FS} + V_{ER2} \quad (16)$$

For a specific SD DAC implementation, both $V_{FS}$ and $V_{ER2}$ are constants and d is known. Therefore, it is possible to correct for the "$d^2 V_{ER2}$" error term by subtracting it out of the output voltage. This may be expressed mathematically as:

$$V_{OUT}' = V_{OUT} - d^2 V_{ER2} \quad (17)$$

where $V_{OUT}'$ represents the corrected output voltage. By substituting for $V_{OUT}$, equation (17) becomes equation (18) which reduces to the desired output, $V_0$.

$$V_{OUT}' = dV_{FS} + d^2 V_{ER2} - d^2 V_{ER2} \quad (18)$$

$$V_{OUT}' = dV_{FS} \quad (19)$$

$$V_{OUT}' = V_0 \quad (20)$$

Figure 8:
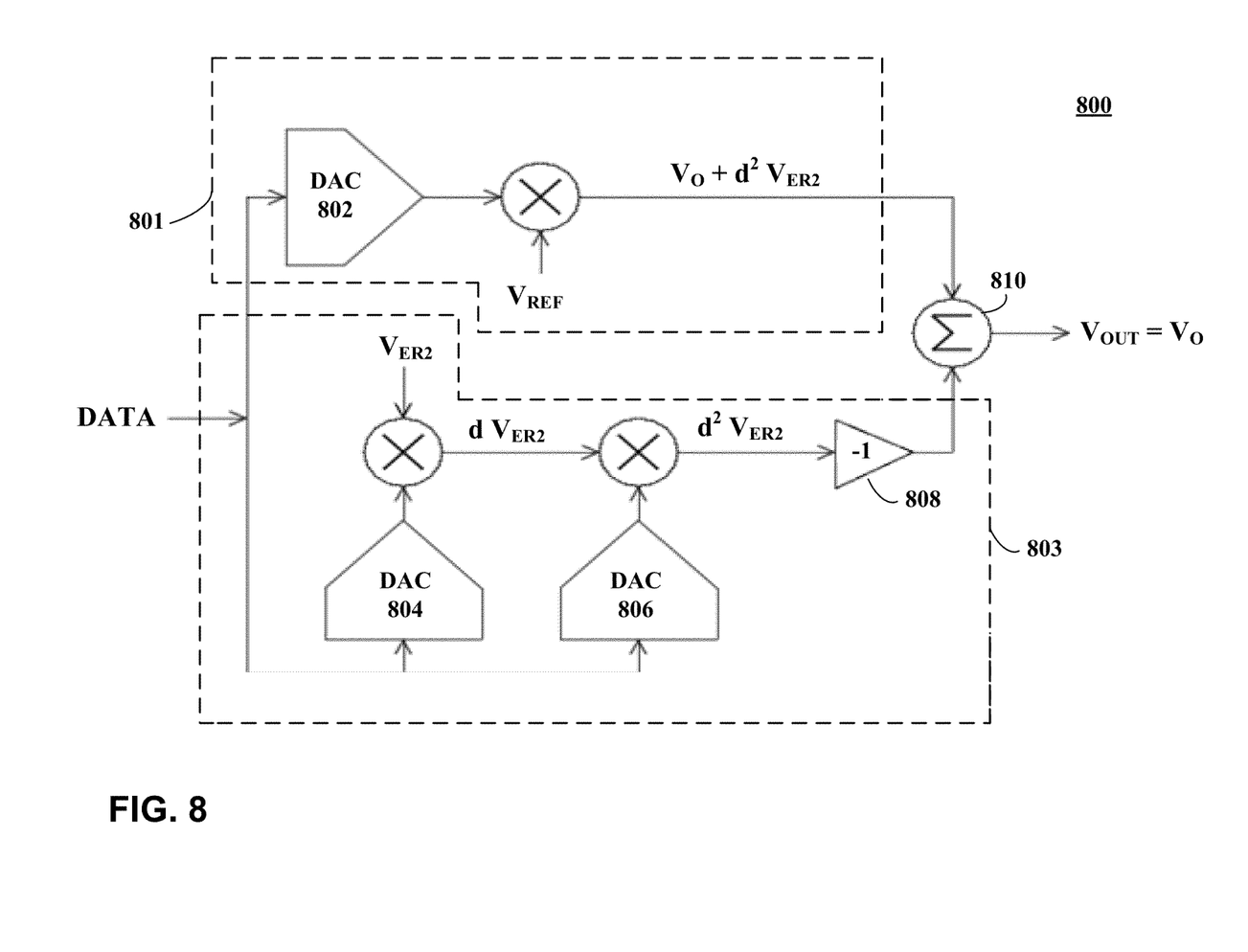
FIG. 8 shows a block diagram of an example system that produces an error correction signal to correct for distortion in the output signal of an SD DAC in accordance with the techniques of this disclosure.

FIG. 8 is a circuit diagram that shows an example of a circuit 800 capable of correcting for non-linearity due to the first order term of a resistor voltage coefficient. Circuit 800 includes upper path 801 which produces an uncorrected output signal and error correction path 803 which produces a correction signal. Upper path 801 includes SD DAC 802 which produces an output voltage ($V_o + d^2 V_{ER2}$), where $V_o$ represents an ideal voltage and $d^2 V_{ER2}$ represents an error term present in the output voltage. DAC 802 can be a current-mode SD DAC such as those described above in relation to FIGS. 5 and 6 or may be a current-mode DAC of another form. Error correction path 803 includes DAC 804 and DAC 806, which produce the error correction voltage $d^2 V_{ER2}$. Inverter 808 inverts the error correction signal, and summer 810 adds the inverted correction signal to the uncorrected signal produced by SD DAC 802 to generate a corrected linear output signal. In the example of FIG. 8, the same data is applied to all three DACs (i.e. SD DAC 802, DAC 804, and DAC 806). Inverter 808 is shown as being placed after DAC 804 and DAC 806, but inverter 808 can be anywhere in the error correction path. For example, inverter 808 could alternatively be placed between DAC 804 and DAC 806 or at the input to DAC 804.

While FIG. 8 generally shows error correction path 803 generating an error correction voltage that matches the error term produced by upper path 801, in actual implementations, the error correction voltage produced by error correction path 803 may be an approximation of the error term produced by upper path 801. Accordingly, when implemented, error correction path 803 may reduce but not completely eliminate distortion present in $V_{OUT}$. For example, while the circuit 800 shown in FIG. 8 does not correct the distortion due to the higher order terms of the resistor voltage coefficient, in many applications, correcting non-linearity due to the first order term can be of significant benefit because the non-linearity due to the higher order terms is typically much less than that due to the first order term.

In general, the technique explained above with reference to FIG. 8 may be used to correct for second order non-linearities in any type of DAC (not just SD DACs) due to any root cause, including causes other than polysilicon resistors. In particular, these techniques may be useful for canceling resistor self-heating effects which can cause a second-order distortion.

As previously mentioned, the two DACs (i.e. 804 and 806) in error correction path 803 of FIG. 8 do not need to be SD DACs. They can be implemented using other techniques known in the art. For example, DAC 804 and DAC 806 can use either the serial PDM encoded bit stream or the parallel data that is used to generate the bit stream. In configurations where DAC 804 and DAC 806 use parallel data, then DAC 804 and DAC 806 may not need to use all of the bits, as only some of the most significant bits might be necessary. For example, in the case discussed previously where the voltage coefficient is −1000 ppm/V, the eight least significant bits could be ignored without any significant loss of accuracy. However, using SD DACs in error correction path 803 may be desirable for some applications.

FIG. 9 shows circuit 900, which is an example implementation of circuit 800 of FIG. 8. Circuit 900 includes upper path 901 which produces an output voltage across resistor R3 936. Circuit 900 also includes an error correction path 903 which includes SD DAC 904 and SD DAC 906. SD DAC 904, as shown in the circuit diagram of FIG. 9, is a first order voltage-mode SD DAC, while SD DAC 906 is a second order voltage-mode SD DAC. SD DAC 904 includes current conveyor 907, and SD DAC 906 includes current conveyor 908 and current conveyor 909. SD DAC 904 and SD DAC 906 generally operate in the same manner as described above for SD DAC 200 of FIG. 2 and SD DAC 400 of FIG. 4.

The subtraction of the error voltage ($V_Y = d^2 V_{ER2}$) may be performed as a current summation of the currents flowing through the matched resistors R2 931 and RY 932 into the low impedance input of an output current conveyor 933. As current conveyors 911 and 933 in upper path 901 automatically perform an inversion, the sign of $I_2$ is inverted from the sign of $I_Y$ so that $I_{OUT} = I_2 - I_Y$. In this manner, the first order non-linearity of the output resistor, R3 936, is compensated.

While voltage-mode SD DAC 904 and voltage-mode SD DAC 906 used in the error correction stage of circuit 900 may also suffer from their own non-linearities per equation (6), these errors are generally not significant because the value of $V_{ER2}$ required to make circuit 900 work effectively is typically very small relative to $V_{REF}$. Therefore, the distortion introduced by non-linear resistors in error correction path 903 is typically very small compared to the distortion introduced by the output resistor, R3 936. For example, if the maximum value of $V_O$ is 4V and all of the resistors have a voltage coefficient of −1000 ppm/V as before, then $V_{ER2}$ will be −16 mV.

$$V_{ER2} = (r_1/r_0)V_{FS}^2 = (-0.001)(16V) = -16 \text{ mV} \tag{21}$$

The maximum voltage error introduced by this type of SD DAC occurs at d=0.2 and d=0.8. In both cases, the magnitude of this error at the output of the first SD DAC is 7.8 uV (16 mV×487 ppm). This error is multiplied by the second DAC so that, at its output, the magnitude of the error voltage is 6.2 uV at d=0.8 and 1.6 uV at d=0.2. At d=0.8, the relative contribution of this error to the final output is 2 ppm (6.2 uV/3.2V)

and, at d=0.2, the relative contribution of this error to the output is also 2 ppm (1.6 uV/0.8V). By itself, this limits the overall DAC accuracy to about 19 bits. This is a significant improvement over the native 8-bit accuracy of the uncorrected SD DAC.

For the error correction techniques thus far discussed, one element to the success of the techniques is correctly setting $V_{ER2} = (r_1/r_0)V_{FS}^2$ in each instance. Research indicates that the voltage coefficient, $r_1/r_0$, of polysilicon resistors can be highly dependent on both the layout and the deposition process. Therefore, the voltage coefficient of a particular output resistor generally varies from wafer to wafer and can also vary slightly from die to die on a wafer. In general, $V_{ER2}$ needs to be calibrated for each chip individually as a function of $V_{FS}$ or, equivalently, $V_{REF}$ (assuming that $V_{FS} = k V_{REF}$). $V_{ER2}$ can be generated in a number of different ways. $V_{ER2}$ may, for example, be generated by an external potentiometer with an external pin that allows a user to manually adjust $V_{ER2}$. $V_{ER2}$ may also be generated automatically using on chip components such as a multiplying DAC that receives calibration data generated by a program.

Figure 10:
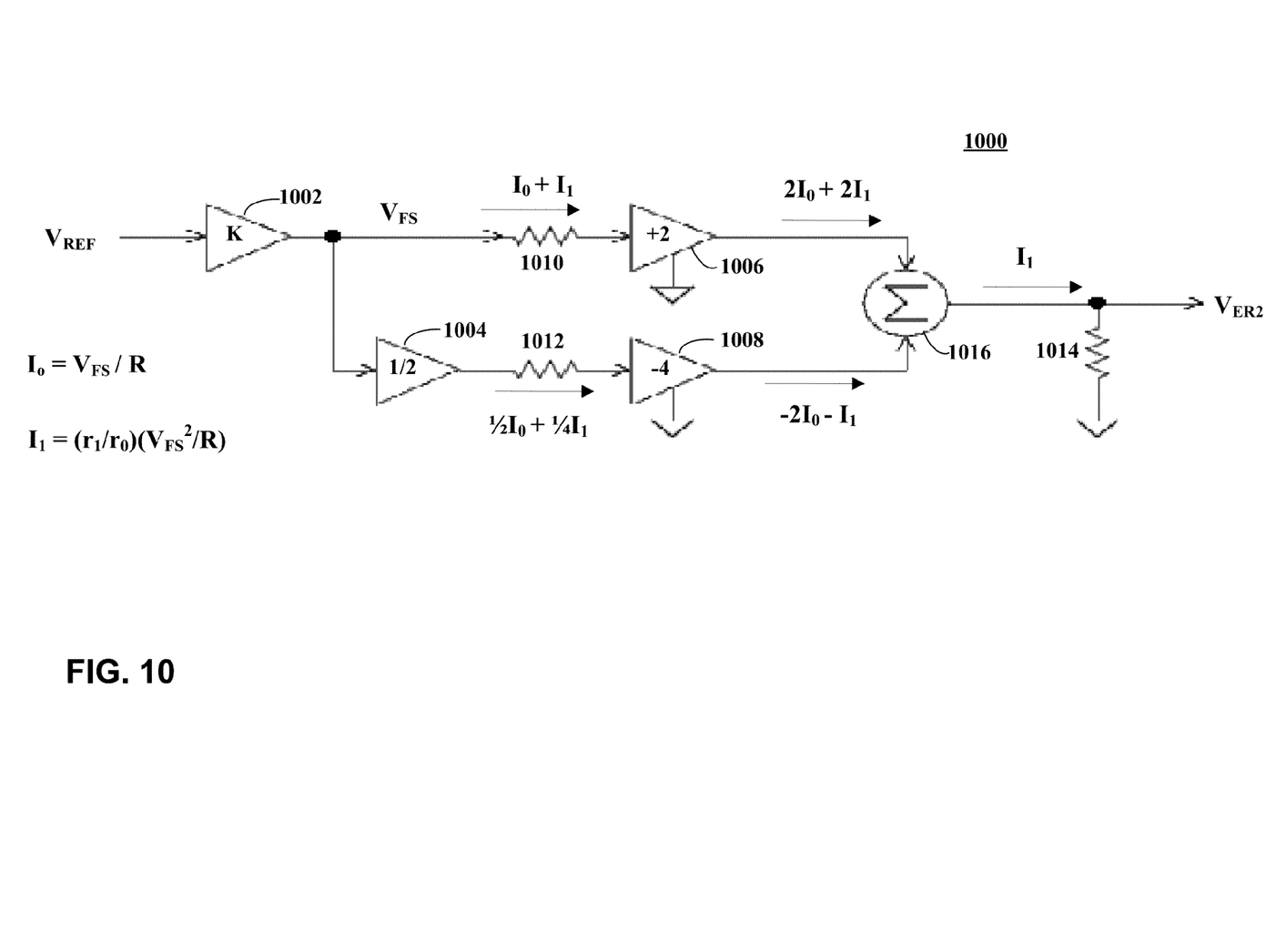
FIG. 10 shows a block diagram of an example system that produces an error correction signal in accordance with the techniques of this disclosure.

There are also other techniques for setting $V_{ER2}$ that do not require calibration, either manually or under program control. An example of such a technique is shown in the block diagram of FIG. 10 where $V_{ER2}$ is determined automatically using replicas of the output resistor that causes the distortion. FIG. 10 shows system 1000, which includes two voltage amplifiers (1002 and 1004), two current amplifiers (1006 and 1008), three matched resistors (1010, 1012, and 1014), and a current summer (1016). In system 1000, all three resistors (1010, 1012, and 1014) are selected to be electrically and physically similar to the resistor which introduces the errors (e.g. resistor 506 in FIG. 5, resistor 606 in FIG. 6, resistor 906 in FIG. 9). The circuit of system 1000 can use the same voltage reference input as the SD DAC (e.g. $V_{REF}$) of an upper stage, and if necessary, amplifies $V_{REF}$ by a constant (k) to produce the full scale output voltage $V_{FS}$. This full scale voltage is then applied to a replica of the output resistor (1010) to develop a current ($I_0 + I_1$), where $I_0$ represents the zeroth order component of the resistor current, and $I_1$ represents the first order component of the resistor current.

This $I_0 + I_1$ current approximately matches the current that is produced by the output resistor when driven to a full scale output by an uncompensated DAC. This replica resistor (1010) is selected to have the same voltage across it as the output resistor and to dissipate the same power in the same area and, therefore, have the same temperature as the output resistor. Accordingly, system 1000 also compensates for first order temperature effects as well as first order voltage coefficients. This replica current ($I_0 + I_1$) is then amplified by a factor of two by current amplifier 1006, which is referenced to ground (or, in general, the output voltage when DIN=0). Ground referenced current amplifier 1008, with a gain of −4, senses the current that normally flows through an uncompensated output resistor when driven to half of the full scale output (½$I_0$+¼$I_1$). This ½$V_{FS}$ voltage can be supplied by voltage amplifier 1004, with a gain of one-half. These two current amplifiers produce two currents, $2I_0 + 2I_0$ and $−2I_0 − I_1$, which are then summed by current summer 1016 to produce the output current, $I_1 = (r_1/r_0)(V_{FS}^2/R)$. This current is then passed through the output resistor (1014) to develop $V_{ER2} = (r_1/r_0)V_{FS}^2$. Note that $V_{ER2}$ is positive if ($r_1/r_0$) is positive and negative if ($r_1/r_0$) is negative. The inversion of this signal, $−V_{ER2}$, may also be produced by changing the gain of current amplifier 1006 to −2 and the gain of current amplifier 1008 to +4.

Figure 11:
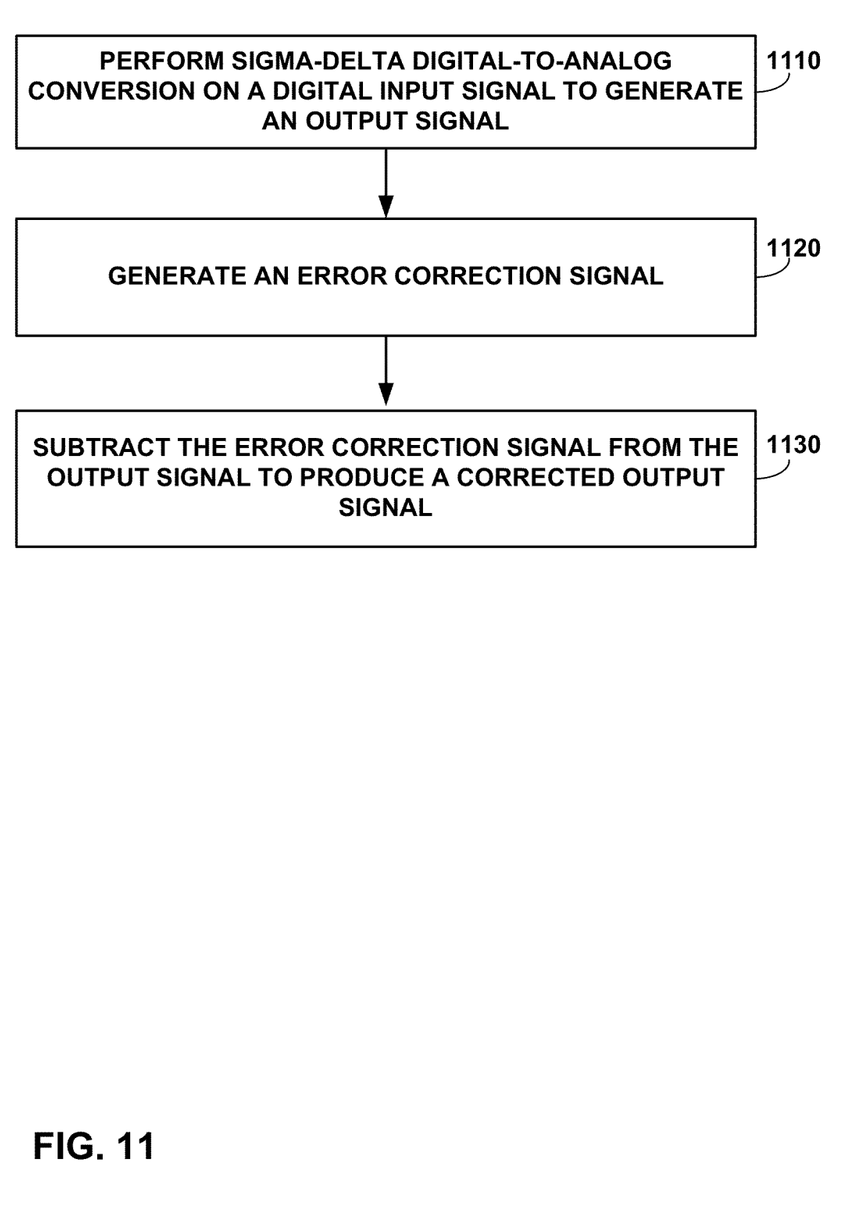
FIG. 11 shows a flow chart illustrating techniques of this disclosure.

FIG. 11 shows a flow chart illustrating a technique for performing sigma-delta digital-to-analog conversion in accordance with this disclosure. The technique of FIG. 11 can be performed, for example, by one or more of the systems and circuits shown in FIGS. 1, 2, 4, 5, 6, 8, 9, and 10. According to the techniques of FIG. 1, an SD DAC, such as SD DAC 110 of FIG. 1, SD DAC 200 of FIG. 2, SD DAC 400 of FIG. 4, SD DAC 500 of FIG. 5, SD DAC 600 of FIG. 6, SD DAC 800 of FIG. 8, or upper stage 901 of FIG. 9, performs sigma-delta digital-to-analog conversion on a digital input signal to generate an output signal (1110). An error correction stage, such as error correction path 803 of FIG. 8, error correction path 903 of FIG. 9, or system 1000 of FIG. 10, generates an error correction signal (1120). A summer, such as summer 810, adds the error correction signal to the output signal to produce a corrected output signal (1130). The error correction signal can be determined based on a voltage coefficient of an output resistor, and the error correction signal corresponds approximately to $d^2 V_{ER2}$, where d corresponds to a density-of-ones (d) of a pulse-density modulated (PDM) digital input signal and $V_{ER2}$ corresponds to a second order error voltage.

It should be apparent to one skilled in the art that the examples given in this paper of the techniques to reduce SD DAC distortion have been applied to uni-polar signals in order to simplify the illustrations and the mathematics. However, these techniques may also be applied to bi-polar signals. Additionally, the techniques described in this disclosure can be applied to both single-ended circuits and differential circuits. Furthermore, to the extent this disclosure discusses components being the same or values being equal, it is to be understood that the disclosure is describing components that are approximately the same and values that are approximately equal. It is not necessary to use components that are exactly the same or values that are exactly equal in order to implement the techniques described in this disclosure.

Various embodiments of the invention have been described. These and other embodiments are within the scope of the following claims.

The invention claimed is:

1. A sigma-delta (SD) digital-to-analog converter (DAC) comprising:
   a translator stage comprising a sigma-delta modulator, wherein the translator stage is implemented on an integrated circuit;
   a filtering stage comprising an output resistor, wherein the output resistor is an approximately linear resistor, wherein at least a portion of the filtering stage is implemented on the integrated circuit.

2. The SD DAC of claim 1, wherein the translator stage comprises a voltage translator.

3. The SD DAC of claim 1, wherein the translator stage comprises a current translator.

4. The SD DAC of claim 1, wherein the output resistor is implemented off the integrated circuit.

5. The SD DAC of claim 4, wherein the output resistor is a metal film resistor.

6. The SD DAC of claim 4, wherein the output resistor is a carbon film resistor.

7. The SD DAC of claim 1, wherein the output resistor is a switched capacitor resistor.

8. The SD DAC of claim 7, wherein the switched capacitor resistor is connected to an output of the translator stage.

9. The SD DAC of claim 1, wherein the filtering stage is an n-th order filter, wherein n is an integer greater than or equal to 1.

10. A method comprising:
    performing sigma-delta digital-to-analog conversion on a digital input signal to generate an analog output signal;
    generating an error correction signal, wherein the error correction signal is based on a voltage coefficient of an output resistor;
    adding the error correction signal to the analog output signal to produce a corrected output signal.

11. The method of claim 10, wherein the error correction signal corresponds approximately to $d^2 V_{ER2}$, wherein d corresponds to a density-of-ones (d) of a pulse-density modulated (PDM) digital input signal and $V_{ER2}$ corresponds to a second order error voltage.

12. A circuit comprising:
    a first path configured to perform sigma-delta digital-to-analog conversion on a digital input signal to generate an analog output signal;
    an error correction path configured to generate an error correction signal;
    an output resistor;
    a summing stage configured to subtract the error correction signal from the output signal to produce a corrected output signal across the output resistor.

13. The circuit of claim 12, wherein the error correction path comprises two or more digital-to-analog converters.

14. The circuit of claim 13, wherein the two or more digital-to-analog converters comprises at least one sigma-delta digital-to-analog converter.

15. The circuit of claim 12, wherein the circuit is implemented on an integrated circuit.

16. The circuit of claim 12, wherein the output resistor is a polysilicon resistor.

17. The circuit of claim 12, wherein the first path comprises a current-mode sigma-delta analog-to-digital converter.

18. The circuit of claim 12, wherein the error correction path generates the error correction signal based on a voltage coefficient of an output resistor.

19. The circuit of claim 12, wherein the error correction signal corresponds approximately to $d^2 V_{ER2}$, wherein d corresponds to a density-of-ones (d) of a pulse-density modulated (PDM) digital input signal and $V_{ER2}$ corresponds to a second order error voltage.

* * * * *